US010847567B2

(12) United States Patent
Fujisawa et al.

(10) Patent No.: US 10,847,567 B2
(45) Date of Patent: Nov. 24, 2020

(54) INFRARED SENSOR DEVICE INCLUDING INFRARED SENSOR SUBSTRATE AND SIGNAL PROCESSING CIRCUIT SUBSTRATE COUPLED TO EACH OTHER

(71) Applicant: MITSUBISHI ELECTRIC CORPORATION, Chiyoda-ku (JP)

(72) Inventors: Daisuke Fujisawa, Chiyoda-ku (JP); Junji Nakanishi, Chiyoda-ku (JP); Takahiro Onakado, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/347,615

(22) PCT Filed: Sep. 21, 2017

(86) PCT No.: PCT/JP2017/034113
§ 371 (c)(1),
(2) Date: May 6, 2019

(87) PCT Pub. No.: WO2018/131216
PCT Pub. Date: Jul. 19, 2018

(65) Prior Publication Data
US 2019/0333960 A1    Oct. 31, 2019

(30) Foreign Application Priority Data

Jan. 12, 2017    (JP) .................................. 2017-003593

(51) Int. Cl.
*H01L 27/146*    (2006.01)
*H04N 5/33*    (2006.01)
(Continued)

(52) U.S. Cl.
CPC .... *H01L 27/14649* (2013.01); *H01L 27/1462* (2013.01); *H01L 27/14634* (2013.01);
(Continued)

(58) Field of Classification Search
None
See application file for complete search history.

(56) References Cited

U.S. PATENT DOCUMENTS 4,970,567 A    11/1990    Ahlgren et al.
4,994,876 A    2/1991    Hisa
(Continued)

FOREIGN PATENT DOCUMENTS

JP    62-107595 A    5/1987
JP    63-54764 A    3/1988
(Continued)

OTHER PUBLICATIONS

International Search Report dated Nov. 14, 2017 in PCT/JP2017/034113 filed on Sep. 21, 2017.
(Continued)

*Primary Examiner* — Steven B Gauthier
(74) *Attorney, Agent, or Firm* — Xsensus LLP

(57) ABSTRACT

An infrared sensor substrate includes: column signal lines; row signal lines; a pixel array of pixels including infrared detector elements connected to the column signal lines and the row signal lines. The infrared sensor substrate includes: a current source connected to the infrared detector elements via the column signal lines; a voltage source that applies a voltage to the infrared detector elements via the row signal lines; output terminals connected to the column signal lines, the output terminals being connectable to a signal processing circuit substrate that processes output signals of the infrared detector elements. The infrared sensor substrate includes a monitoring terminal capable of monitoring the voltage applied to the infrared detector elements by the first voltage source.

12 Claims, 13 Drawing Sheets

(51) Int. Cl.
*H04N 5/369* (2011.01)
*G01J 5/12* (2006.01)

(52) U.S. Cl.
CPC ......... *H01L 27/14636* (2013.01); *H04N 5/33* (2013.01); *H04N 5/379* (2018.08); *G01J 2005/123* (2013.01)

(56) References Cited

U.S. PATENT DOCUMENTS

| | | | |
|---|---|---|---|
| 5,208,841 A | 5/1993 | Nakanishi | |
| 2004/0095495 A1 | 5/2004 | Inokuma et al. | |
| 2008/0251721 A1* | 10/2008 | Ueno | G01J 5/08 250/332 |
| 2010/0238295 A1* | 9/2010 | Ueno | G01J 1/46 348/164 |
| 2011/0210251 A1* | 9/2011 | Onakado | H04N 5/33 250/332 |
| 2012/0068287 A1 | 3/2012 | Tai et al. | |
| 2014/0084408 A1 | 3/2014 | Bischopink et al. | |
| 2016/0071897 A1 | 3/2016 | Tsukimura | |
| 2016/0079293 A1 | 3/2016 | Ishii et al. | |
| 2016/0126265 A1 | 5/2016 | Ligozat et al. | |

FOREIGN PATENT DOCUMENTS

| | | |
|---|---|---|
| JP | 2-65272 A | 3/1990 |
| JP | 2-502326 A | 7/1990 |
| JP | 3-222483 A | 10/1991 |
| JP | 4-180374 A | 6/1992 |
| JP | 5-90553 A | 4/1993 |
| JP | 5-90647 A | 4/1993 |
| JP | 5-102446 A | 4/1993 |
| JP | 5-218377 A | 8/1993 |
| JP | 2004-146816 A | 5/2004 |
| JP | 2008-153427 A | 7/2008 |
| JP | 2014-68012 A | 4/2014 |
| JP | 2014-239157 A | 12/2014 |
| JP | 2015-537375 A | 12/2015 |
| JP | 2016-58699 A | 4/2016 |

OTHER PUBLICATIONS

Japanese Office Action dated Feb. 13, 2018 in corresponding Japanese Patent Application No. 2018-502283 (with partial English translation).

* cited by examiner

INFRARED SENSOR DEVICE INCLUDING INFRARED SENSOR SUBSTRATE AND SIGNAL PROCESSING CIRCUIT SUBSTRATE COUPLED TO EACH OTHER

TECHNICAL FIELD

The present invention relates to an infrared sensor device including an infrared sensor substrate and a signal processing circuit substrate, the infrared sensor substrate provided with a pixel array of pixels each including an infrared detector element, and the signal processing circuit substrate provided with a signal processing circuit that processes output signals of infrared detector elements. In addition, the present invention also relates to an infrared sensor substrate for such an infrared sensor device.

BACKGROUND ART

In recent years, there has been a demand for infrared sensors in various fields, such as security, medical care, and automotive application, and an attempt has been made to improve detection capability. Among the infrared sensors, for example, there is a thermal infrared sensor (also referred to as "thermal infrared solid-state imaging element") which detects a change in temperature due to incident infrared rays using a two-dimensional array of semiconductor sensors. In particular, the thermal infrared sensors not requiring a cooling apparatus have been made more sensitive in various manners, and more widely used due to its performance, price and ease of use. For automotive applications and the like, sensors with higher performance are required, e.g., for detecting a moving object as a subject, and for detecting a person.

The thermal infrared sensor reads an electric signal indicating a change in physical property value caused by a change in temperature due to heat converted from incident infrared rays. For this reason, the infrared sensor adopts a heat insulating structure in which the infrared detector elements, or infrared detectors, are thermally insulated from a substrate, in order to increase the sensitivity in detecting the infrared rays, that is, in order to increase a change in temperature of a heat sensing unit due to a heat generated by absorbing the incident infrared rays.

Further, in order to improve the heat insulation, the infrared detector elements are held in a vacuum, and the entire infrared sensor is vacuum-sealed within a package, thus preventing a decrease in thermal resistance resulting from conduction or convection through the atmosphere of the infrared detector elements. In the case that the infrared sensor is applied to a noctovision system for automotive application, it is required to improve the infrared sensor in resolution (the number of pixels) and frame rate so as to detect a moving person or object. As a result, the circuit size of the infrared sensor increases, and the chip area and the system mounting area increase, thus eventually increasing its costs.

Then, there is known an infrared sensor as an assembly of an infrared sensor substrate and a signal processing circuit substrate, which are separate from each other and arranged opposite to each other, the infrared sensor substrate provide with a pixel array of pixels each including an infrared detector element, and the signal processing circuit substrate provided with a signal processing circuit (analog/digital converter etc.) that processes output signals of infrared detector elements. This can prevent an increase in the chip area and the mounting area by a simple manufacturing process. By disposing the infrared sensor substrate on the signal processing circuit substrate, a small and high-performance imaging element is achieved. For example, Patent Document 1 discloses a solid-state imaging apparatus in which an imaging chip is stacked on an image processing chip as described above.

However, while the imaging chip and the image processing chip are manufactured using certain manufacturing processes, respectively, disconnections in wiring, defects in detector pixels, or the like may occur during the manufacturing process. The final test of the sensor can not be performed, unless the imaging chip and the image processing chip are assembled into the sensor. Therefore, a defective chip is also assembled and tested, thus resulting in an unnecessary increase in assembly cost. In order to deal with such a problem, some conventional solid-state imaging elements are provided with a disconnection check circuit thereon, for determining disconnections in wiring without actual operation of the sensor. Thus, it is possible to eliminate unnecessary wafer test and assembly step for the defective element to reduce a cost burden. For example, Patent Document 2 discloses such a solid-state imaging element.

CITATION LIST

Patent Documents

PATENT DOCUMENT 1: Japanese Patent Laid-open Publication No. 2004-146816
PATENT DOCUMENT 2: Japanese Patent Laid-open Publication No. H04-180374

SUMMARY OF INVENTION

Technical Problem

When the conventional manufacturing processes for a solid-state imaging apparatus and a solid-state imaging element are applied to a device made using a special manufacturing process, such as an infrared sensor including infrared detector elements, the following problems arise. As disclosed in Patent Document 1, in the case that the final test of the sensor is performed after the infrared sensor substrate and the signal processing circuit substrate are assembled into the infrared sensor, a chip in which defects have occurred during the manufacturing process is also assembled and tested, thus resulting in an unnecessary increase in assembly cost. In addition, as disclosed in Patent Document 2, even if the disconnection check circuit is provided on the element to determine disconnections in wiring without actual operation of the sensor, it is not possible to determine defects on a pixel-by-pixel basis.

An object of the present invention is to provide an infrared sensor substrate that can be tested independently, before an infrared sensor substrate and a signal processing circuit substrate are assembled into an infrared sensor device. In addition, an object of the present invention is to provide an infrared sensor device including such an infrared sensor substrate and a signal processing circuit substrate.

Solution to Problem

According to an aspect of the present invention, an infrared sensor device is provided, including: an infrared sensor substrate formed on a first semiconductor substrate; and a signal processing circuit substrate formed on a second semiconductor substrate. The infrared sensor substrate includes: a plurality of first signal lines extending along a first direction on the first semiconductor substrate; a plurality of second signal lines extending along a second direction on the first semiconductor substrate; a pixel array including a plurality of pixels arranged in a two-dimensional array along the first direction and the second direction, the plurality of pixels including infrared detector elements, respectively, each of the infrared detector elements connected to one of the plurality of first signal lines and connected to one of the plurality of second signal lines. The infrared sensor substrate includes: a first current source connected to the infrared detector elements via the plurality of first signal lines, respectively; a first voltage source that applies a voltage to the infrared detector elements via the plurality of second signal lines, respectively; and a plurality of output terminals corresponding to the plurality of first signal lines one-by-one basis, and connected to the plurality of first signal lines, respectively; a plurality of input terminals corresponding to the plurality of second signal lines one-by-one basis, and connected to the plurality of second signal lines, respectively. The infrared sensor substrate includes a monitoring terminal capable of monitoring the voltage applied to the infrared detector elements by the first voltage source. The signal processing circuit substrate includes: a plurality of input terminals electrically connected to the plurality of output terminals of the infrared sensor substrate, respectively; a signal processing circuit that receives and processes output signals of the infrared detector elements of the infrared sensor substrate via the plurality of input terminals of the signal processing circuit substrate, the plurality of output terminals of the infrared sensor substrate, and the plurality of first signal lines; a plurality of output terminals electrically connected to the plurality of input terminals of the infrared sensor substrate, respectively; and a second voltage source that applies a voltage to the infrared detector elements via the plurality of output terminals of the signal processing circuit substrate, the plurality of input terminals of the infrared sensor substrate, and the plurality of second signal lines. The first voltage source applies the voltage to the infrared detector elements, at the same time as the second voltage sources applies the voltage to the infrared detector elements.

Advantageous Effects of Invention

According to the present invention, it is possible to provide the infrared sensor substrate that can be tested independently, before the infrared sensor substrate and the signal processing circuit substrate are assembled into the infrared sensor device.

DESCRIPTION OF EMBODIMENTS

First Embodiment

Figure 1:
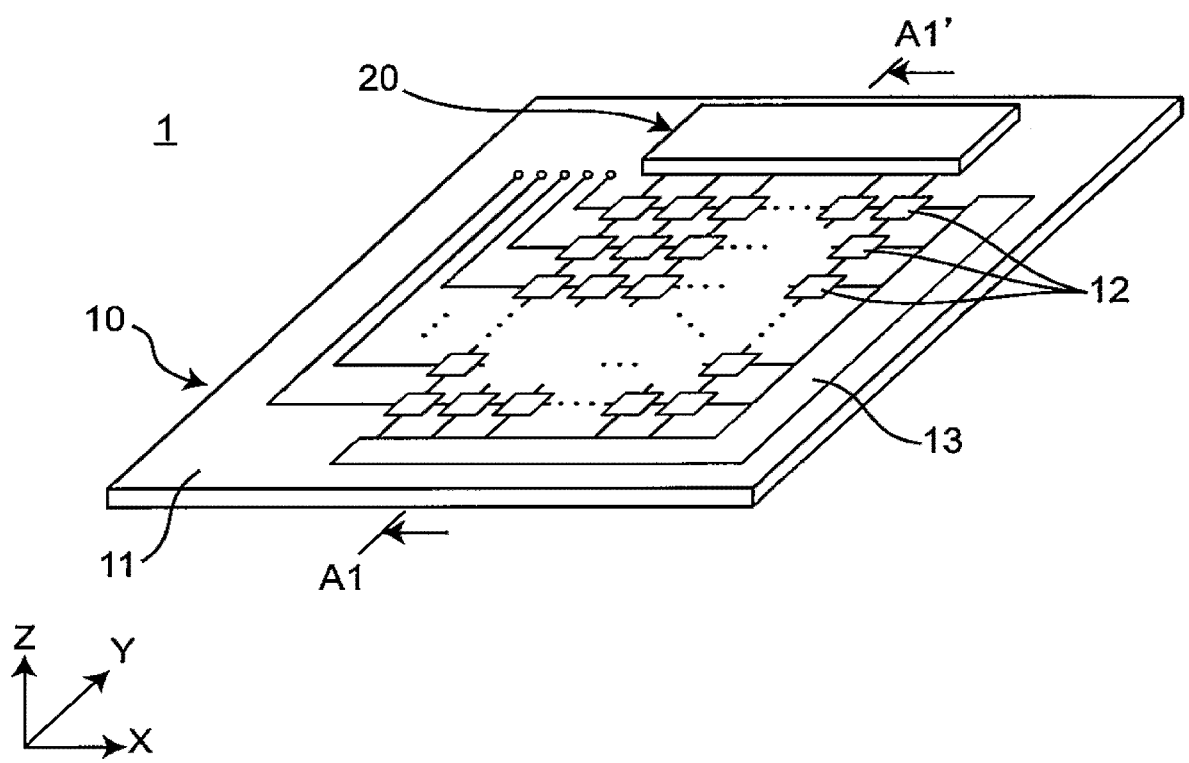
FIG. 1 is a perspective view illustrating a schematic configuration of an infrared sensor device according to a first embodiment of the present invention.
Figure 2:
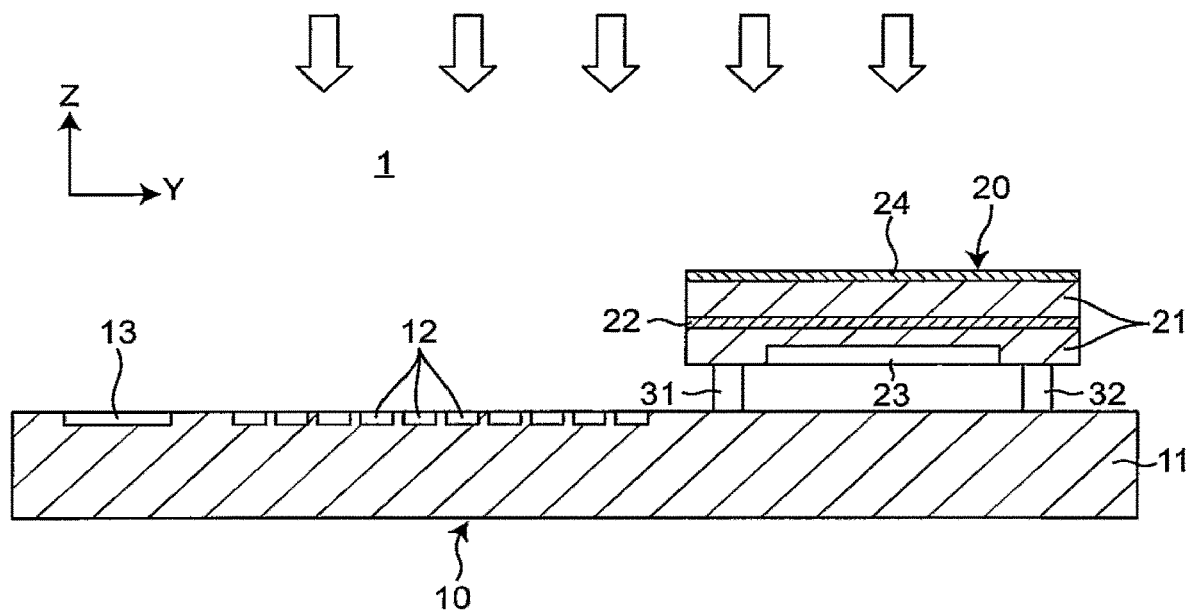
FIG. 2 is a cross sectional view illustrating a schematic configuration of the infrared sensor device according to the first embodiment of the present invention.

FIG. 1 is a perspective view illustrating a schematic configuration of an infrared sensor device 1 according to a first embodiment of the present invention. FIG. 2 is a cross sectional view illustrating the schematic configuration of the infrared sensor device 1 according to the first embodiment of the present invention. FIG. 2 is a cross sectional view along a line A1-A1' in FIG. 1.

The infrared sensor device 1 includes an infrared sensor substrate 10 and a signal processing circuit substrate 20. The infrared sensor substrate 10 and the signal processing circuit substrate 20 are assembled opposed to each other at a distance equal to a predetermined height.

As shown in FIG. 2, infrared rays are incident on the +Z side surfaces of the infrared sensor substrate 10 and the signal processing circuit substrate 20.

As shown in FIG. 1, the infrared sensor substrate 10 is funned on a first semiconductor substrate 11. The infrared sensor substrate 10 is provided with a pixel array in which a plurality of pixels 12 each including an infrared detector element are arranged in a two-dimensional array, and a controller circuit 13 for controlling the pixels 12.

When manufacturing the infrared sensor substrate 10, at first, the first semiconductor substrate 11 (silicon substrate) is processed using some wafer process to form the pixel array of the pixels 12 and the controller circuit 13, prior to formation of a heat insulating structure. Thereafter, a metallized pattern is formed on the surface of the first semiconductor substrate 11 for connection with the signal processing circuit substrate 20. Specifically, for example, using sputtering, a chromium layer is formed on the entire surface of the first semiconductor substrate 11, and then a copper layer is formed thereon. Then, a resist pattern is formed by photolithography (lithography technique). Next, using electrolytic plating, a nickel layer is formed, and then a gold layer is formed. Thereafter, the resist is removed, and a base layer is removed, to form a metallized pattern. Subsequently, a wafer is diced and separated into individual chips, and then, using micromachining technique to perform silicon etching or the like, the infrared sensor substrate 10 including the pixel array of the pixels 12 having a heat insulating structure is manufactured. Note that it is not necessary to dice a wafer during manufacture, and the infrared sensor substrate 10 may be manufactured by processing the entire wafer in the same manner.

As shown in FIG. 2, the signal processing circuit substrate 20 is formed on a second semiconductor substrate 21. The signal processing circuit substrate 20 is provided with a ground conductor 22 and a signal processing circuit 23. The signal processing circuit 23 processes output signals of the infrared detector elements of the infrared sensor substrate 10. The signal processing circuit 23 includes a reading circuit for reading out the output signals of the infrared detector elements, an amplifier for amplifying the signal, a sample hold, an analog/digital converter, a digital signal processing circuit, and the like. An anti-reflection film 24 (anti-reflection (AR) coating) for infrared rays may be formed on the +Z side surface of the signal processing circuit substrate 20 for the purpose of preventing generation of stray light components due to reflected light of incident infrared rays.

The signal processing circuit substrate 20 is manufactured separately from the infrared sensor substrate 10 made using a special manufacturing process, and therefore, the signal processing circuit substrate 20 can be manufactured using a conventional and common silicon wafer process.

The +Z side surface of the infrared sensor substrate 10 and the −Z side surface of the signal processing circuit substrate 20 are opposed to each other via a plurality of bumps 31 and a plurality of dummy bumps 32, and mechanically coupled to each other at a distance equal to heights of the bumps 31 and the dummy bumps 32. The bumps 31 are made of a conductive material, and electrically connect circuits of the infrared sensor substrate 10 and circuits of the signal processing circuit substrate 20. On the other hand, the dummy bumps 32 do not electrically connect the circuits of the infrared sensor substrate 10 and the circuits of the signal processing circuit substrate 20. In the present specification, the bumps 31 are also referred to as "first bumps", and the dummy bumps 32 are also referred to as "second bumps".

The bump 31 and the dummy bump 32 may be made of different materials. In this case, the material of the dummy bumps 32 may have a melting temperature higher than a melting temperature of the material of the bumps 31. For example, when the material of the bumps 31 is indium or an indium alloy, the material of the dummy bumps 32 may be nickel, copper, or the like. By using the bumps 31 and the dummy bumps 32 having different melting temperatures from each other, the infrared sensor substrate 10 and the signal processing circuit substrate 20 can be mechanically and electrically coupled as follows. At first, the dummy bumps 32 are heated and melted at a temperature higher than the melting temperature of the dummy bumps 32, and the infrared sensor substrate 10 and the signal processing circuit substrate 20 are mechanically coupled to each other by the dummy bumps 32. As a result, the infrared sensor substrate 10 and the signal processing circuit substrate 20 are separated from each other by the height of the dummy bumps 32. Next, the bumps 31 are heated and melted at a temperature higher than the melting temperature of the bumps 31 and lower than the melting temperature of the dummy bumps 32. The infrared sensor substrate 10 and the signal processing circuit substrate 20 are mechanically and electrically coupled to each other by bumps 31 at a distance equal to the height of the dummy bumps 32. As a result, the distance between the infrared sensor substrate 10 and the signal processing circuit substrate 20 is determined by the height of the dummy bumps 32. Since the material of the dummy bumps 32 has the melting temperature higher than the melting temperature of the material of the bumps 31 as described above, the infrared sensor substrate 10 and the signal processing circuit substrate 20 can be coupled to each other with high accuracy.

As described above, the infrared sensor substrate 10 and the signal processing circuit substrate 20 can be assembled into the final infrared sensor device 1.

As shown in FIG. 1 etc., the size of the infrared sensor substrate 10 may be larger than the size of the signal processing circuit substrate 20, or vice versa. In the example of the present specification, infrared rays are incident from the direction in which the signal processing circuit substrate 20 is provided with respect to the infrared sensor substrate 10. Hence, the pixel array of the pixels 12 is provided on one of two surfaces of the infrared sensor substrate 10, the one surface opposite to the signal processing circuit substrate 20.

Figure 3:
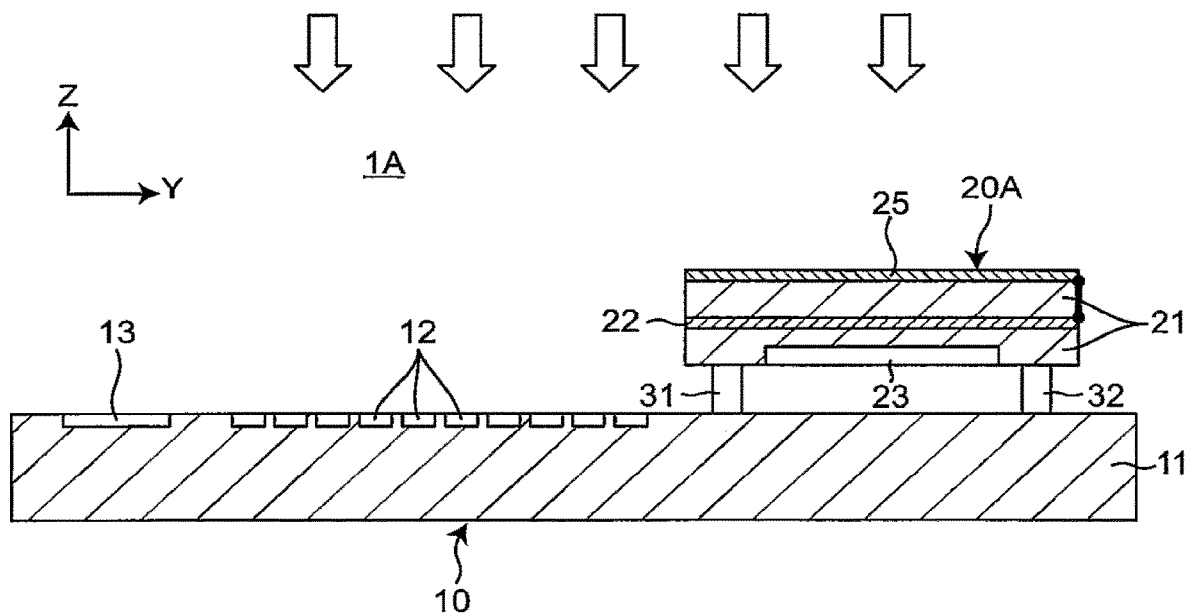
FIG. 3 is a cross sectional view illustrating a schematic configuration of an infrared sensor device according to a modified embodiment of the first embodiment of the present invention.

FIG. 3 is a cross sectional view illustrating a schematic configuration of an infrared sensor device 1A according to a modified embodiment of the first embodiment of the present invention. The infrared sensor device 1A includes a signal processing circuit substrate 20A, instead of the signal processing circuit substrate 20 of FIG. 2. On the +Z side surface of the signal processing circuit substrate 20A, there is formed a getter thin film 25 for maintaining the degree of vacuum and reflecting infrared rays, instead of the anti-reflection film 24 of FIG. 2. The getter thin film 25 is connected to the ground conductor 22 of the signal processing circuit substrate 20. By connecting the getter thin film 25 to the ground conductor 22 of the signal processing circuit substrate 20, it is possible to use the getter thin film 25 as a shield against noise to reduce influence of noise.

Figure 4:
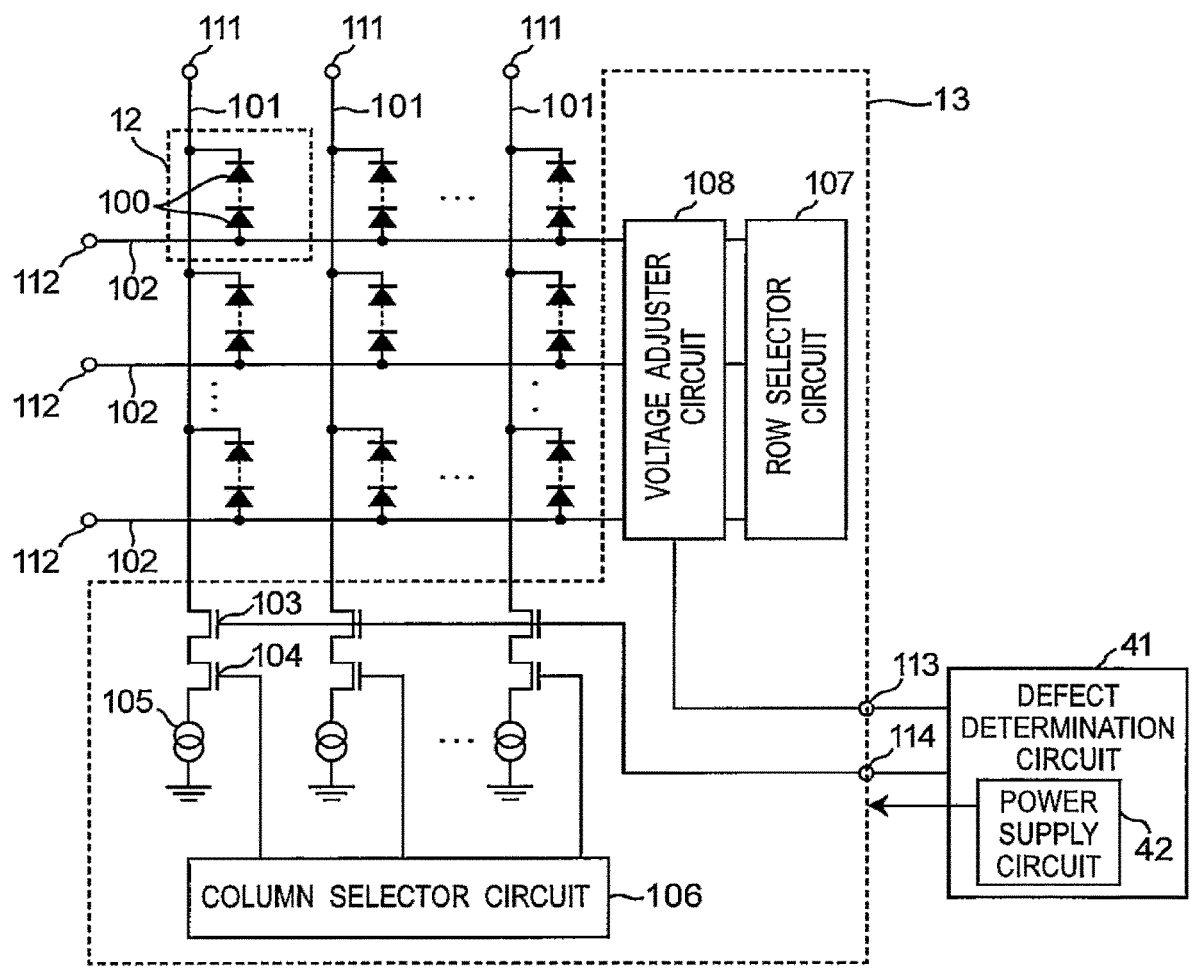
FIG. 4 is a circuit diagram illustrating a pixel array and a controller circuit of an infrared sensor substrate according to the first embodiment of the present invention.

FIG. 4 is a circuit diagram illustrating the pixel array and the controller circuit 13 of the infrared sensor substrate 10 according to the first embodiment of the present invention.

On the infrared sensor substrate 10, there are formed a plurality of column signal lines 101 extending along the Y direction on the first semiconductor substrate 11, a plurality of row signal lines 102 extending along the X direction on the first semiconductor substrate 11. In the present specification, the Y direction is also referred to as a "first direction" or a "vertical direction", and the X direction is also referred to as a "second direction" or a "horizontal direction". In addition, in the present specification, the column signal lines 101 are also referred to as "first signal lines", and the row signal lines 102 are also referred to as "second signal lines". A plurality of pixels 12 are arranged in a two-dimensional array along the Y direction and the X direction to form the pixel array, and each of the plurality of pixels 12 includes an infrared detector element 100 connected to one of the plurality of column signal lines 101 and connected one of the plurality of row signal lines 102. A terminal 111 is connected to one end of each column signal line 101, and a terminal 112 is connected to one end of each row signal line 102. The terminals 111 and 112 can be connected to the signal processing circuit substrate 20 via the bumps 31. In the present specification, the terminals 111 are also referred to as "output terminals" of the infrared sensor substrate 10, and the terminals 112 are also referred to as "input terminals" of the infrared sensor substrate 10.

The infrared detector elements 100 of the pixels 12 are held on the first semiconductor substrate 11 without direct contact, for example, by supporting legs. Each of the infrared detector elements 100 may be a diode, a resistance bolometer, a thin film ferroelectric, or an element using the microelectromechanical systems (MEMS) technology, such as a thermoelectric element.

The controller circuit 13 includes switching elements 103, switching elements 104, current sources 105, one column selector circuit 106, one row selector circuit 107, and one voltage adjuster circuit 108. Each of the switching elements 103, each of the switching elements 104, and each of the current sources 105 are provided per one column signal line 101. Each current source 105 is connected to the column signal line 101 via the switching elements 103 and 104, and is connected to the infrared detector elements 100 of the pixels 12 via the column signal line 101. In the present specification, the current sources 105 are also referred to as a "first current source". The switching elements 103 connect or disconnect the current sources 105 to or from the column signal lines 101, in accordance with a control signal inputted from a terminal 114. The switching elements 103 are turned on only when testing the infrared sensor substrate 10. The column selector circuit 106 selectively connects the current sources 105 to the infrared detector elements 100 via the corresponding column signal lines 101 by using the switching elements 104. The row selector circuit 107 selectively applies a voltage to the infrared detector elements 100 via the row signal lines 102. The voltage adjuster circuit 108 applies a variable voltage to the infrared detector elements 100 of the pixels 12 via the row signal lines 102, in accordance with a control signal inputted from a terminal 113. In the present specification, the row selector circuit 107 and the voltage adjuster circuit 108 are also referred to as a "first voltage source", and the terminal 113 is also referred to as a "monitoring terminal".

Figure 5:
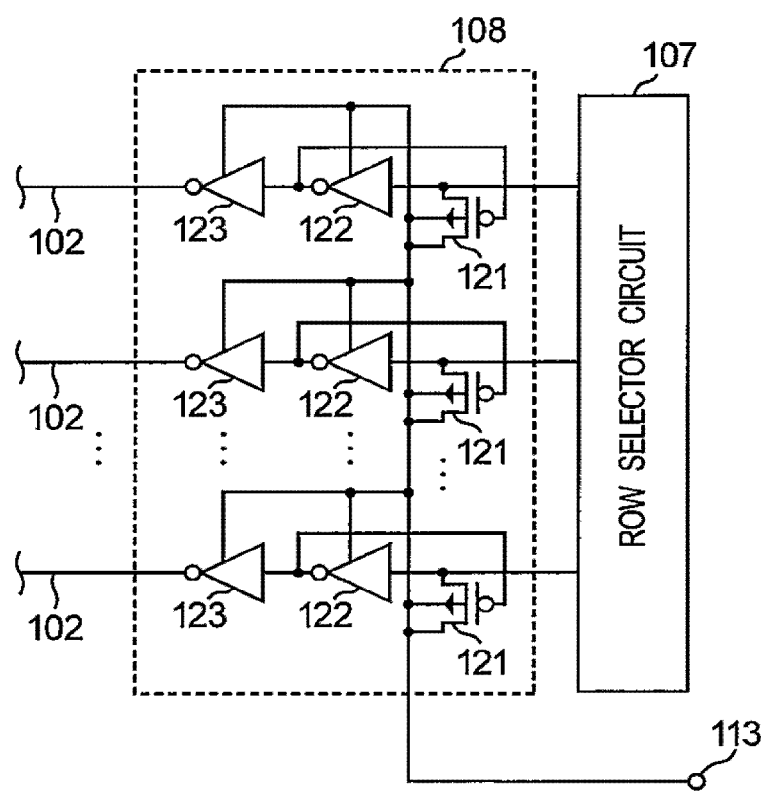
FIG. 5 is a circuit diagram illustrating a voltage adjuster circuit of the infrared sensor substrate according to the first embodiment of the present invention.

FIG. 5 is a circuit diagram illustrating the voltage adjuster circuit 108 of the infrared sensor substrate 10 according to the first embodiment of the present invention. The voltage adjuster circuit 108 includes switching elements 121, amplifiers 122, and amplifiers 123, each of which are provided per one row signal line 102. The switching elements 121 and the amplifiers 122 and 123 operate as buffer circuits, and their output voltage vary in accordance with the control signal inputted from the terminal 113.

Again referring to FIG. 4, when testing the infrared sensor substrate 10, a defect determination circuit 41 is connected to the terminals 113 and 114 of the controller circuit 13. The defect determination circuit 41 includes a power supply circuit 42, and supplies electric power necessary for testing the infrared sensor substrate 10, to the controller circuit 13. Via the terminal 113, the defect determination circuit 41 sets a voltage to be applied to the infrared detector elements 100. Further, via the terminal 113, the defect determination circuit 41 can monitor a voltage to be applied to the infrared detector elements 100 by the row selector circuit 107 and the voltage adjuster circuit 108.

As described above, the infrared sensor substrate 10 includes at least means for applying a voltage and supplying currents to the pixel array (i.e., the current sources 105, the column selector circuit 106, the row selector circuit 107, and the voltage adjuster circuit 108), among those of the signal processing circuit 23 of the signal processing circuit substrate 20. The column selector circuit 106 and the row selector circuit 107 can select, one by one, the pixels 12 arranged in the two-dimensional array. The row selector circuit 107 and the voltage adjuster circuit 108 applies a variable voltage to the infrared detector elements 100 of the pixels 12 and monitors the voltage, so that the defect determination circuit 41 determines defective pixels or defective lines.

In the case that the voltage supplied from the terminal 113 is used a power source for the pixels 12, for example, when a short circuit occurs in a certain pixel 12, abnormal voltage and current are generated at the terminal 113. The defect determination circuit 41 detects such abnormal voltage and current, and therefore, even when the signal processing circuit substrate 20 is not connected to the infrared sensor substrate 10, the defect determination circuit 41 can test only the infrared sensor substrate 10 to determine disconnections, short circuits, or leakage currents of the pixels 12. Hence, it is possible to screen defective chips without actually operating the entire infrared sensor device 1.

Figure 6:
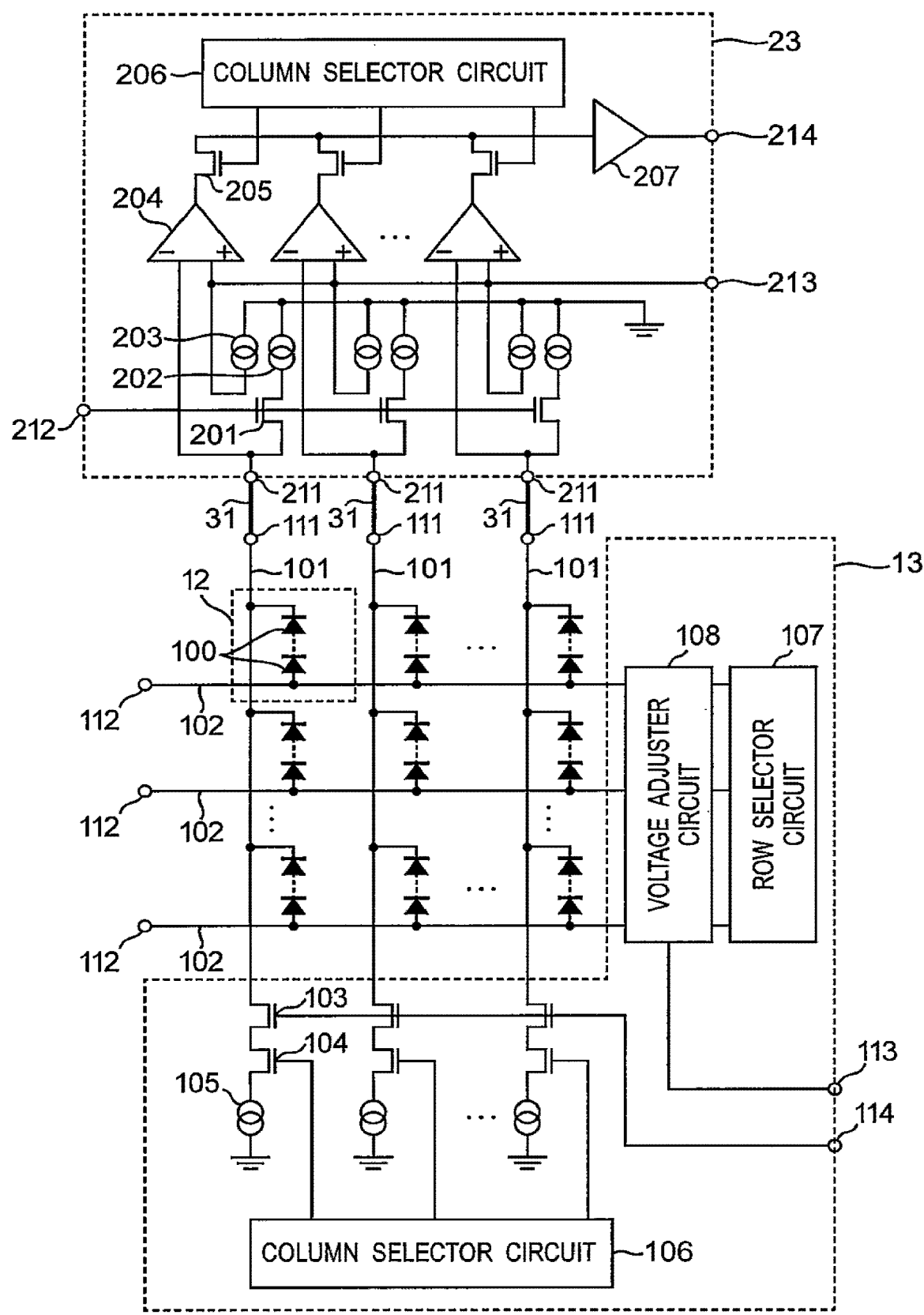
FIG. 6 is a circuit diagram in which the infrared sensor substrate and a signal processing circuit substrate according to the first embodiment of the present invention are assembled into the infrared sensor device.

FIG. 6 is a circuit diagram in which the infrared sensor substrate and the signal processing circuit substrate according to the first embodiment of the present invention are assembled into the infrared sensor device. The plurality of terminals 111 of the infrared sensor substrate 10 are connected to a plurality of terminals 211 of the signal processing circuit substrate 20 via the plurality of bumps 31. In the present specification, the terminals 211 are also referred to as "input terminals" of the signal processing circuit substrate 20.

The signal processing circuit 23 of the signal processing circuit substrate 20 includes switching elements 201, current sources 202, current sources 203, operational amplifiers 204, switching elements 205, one column selector circuit 206, and one amplifier 207. Each of the switching elements 201, each of the current sources 202, each of the current sources 203, each of the operational amplifiers 204, and each of the switching elements 205 are provided per one terminal 211. Each terminal 211 is connected to an inverting input terminal of the operational amplifier 204, and further connected to a non-inverting input terminal of the operational amplifier 204 via the switching element 201 and the current sources 202 and 203. Accordingly, the current sources 202 and 203 are connected to the infrared detector elements 100 of the pixels 12 via the terminals 211 of the signal processing circuit substrate 20, the bumps 31, the terminals 111 of the infrared sensor substrate 10, and the column signal lines 101. In the present specification, the current sources 202 and 203 are also referred to as a "second current source". Bias voltages are further applied to the non-inverting input terminals of the operational amplifiers 204 via a terminal 213. The switching elements 201 connect or disconnect the terminals 211 to or from the current sources 202 and 203, in accordance with a control signal inputted from a terminal 212. The switching element 201 is turned on when actually operating the infrared sensor device 1 to capture an image. The operational amplifiers 204 operate as integrator circuits. The column selector circuit 206 selectively transmits output signals of the operational amplifiers 204 to the amplifier 207, using the switching elements 205. The amplifier 207 outputs an amplified signal to a terminal 214.

When actually operating the infrared sensor device 1 to capture an image, the column selector circuit 206 of the signal processing circuit substrate 20, and the row selector circuit 107 of the infrared sensor substrate 10 can select, one by one, the pixels 12 arranged in the two-dimensional array.

When actually operating the infrared sensor device 1 to capture an image, the infrared detector elements 100 of the pixels 12 is connected to not the current sources 105 of the infrared sensor substrate 10, but the current sources 202 and 203 of the signal processing circuit substrate 20. The row selector circuit 107 and the voltage adjuster circuit 108 apply a variable voltage to the infrared detector elements 100 of the pixels 12. Each of the operational amplifiers 204 receives a voltage across the current source 202 connected to the infrared detector elements 100 of the pixels 12, and a voltage across the current source 203 connected to the terminal 213. As a result, the amplifier 207 outputs a signal in which a voltage drop distribution due to horizontal wiring resistance has been subtracted.

According to FIG. 6, the signal processing circuit substrate 20 includes the integrator circuits of the operational amplifiers 204, to amplify the output signals of the infrared detector elements 100 inputted from the infrared sensor substrate 10 via the bumps 31, and output the amplified signals. The output signals of the infrared detector elements 100 are amplified near the infrared detector elements 100, and then, the signals are converted into digital data using an analog/digital converter. As a result, without influence of subsequent circuits, it is possible to output a desirable signal.

Alternatively, the signal processing circuit substrate 20 may, at first, convert the output signals of the infrared detector elements 100 to digital data using an analog/digital converter, the digital data being highly tolerant to noise and suitable for arithmetic processing, and then, perform various signal processing using a digital signal processing circuit mounted on the signal processing circuit substrate 20.

In addition, the output signal of the digital signal processing circuit may be fed back to the signal processing circuit substrate 20 of the infrared sensor device 1 for more optimal control. In this case, the output signal of the digital signal processing circuit may be converted to an analog voltage signal using a digital/analog converter, and sent to the infrared sensor substrate 10 via another bump 31. In this case, if the digital/analog converter is mounted on not the signal processing circuit substrate 20, but the infrared sensor substrate 10, then the signal can be digitally transmitted and processed.

Note that the case has been described in the first embodiment where the plurality of terminals 111 connected to the column signal lines 101 of the infrared sensor substrate 10 are connected to the plurality of terminals 211 of the signal processing circuit substrate 20 via the plurality of bumps 31. The circuit configurations of the infrared sensor substrate 10 and the signal processing circuit substrate 20 are not limited thereto, and can be appropriately selected in accordance with an application. The plurality of terminals 112 connected to the row signal lines 102 of the infrared sensor substrate 10 may be connected to a plurality of terminals of the signal processing circuit substrate 20 via the plurality of bumps 31.

The infrared sensor device 1 according to the first embodiment has the following configurations and advantageous effects.

According to the first embodiment, an infrared sensor substrate (10) formed on a first semiconductor substrate (11). The infrared sensor substrate (10) is provide with: a plurality of first signal lines (101) extending along a first direction (Y) on the first semiconductor substrate (11); a plurality of second signal lines (102) extending along a second direction (X) on the first semiconductor substrate (11); a pixel array in which a plurality of pixels (12) are arranged in a two-dimensional array along the first direction (Y) and the second direction (X), the plurality of pixels (12) including infrared detector elements (100), respectively, each of the infrared detector elements (100) connected to one of the plurality of first signal lines (101) and connected to one of the plurality of second signal lines (102). The infrared sensor substrate (10) is provide with: a first current source (105) connected to the infrared detector elements (100) via the plurality of first signal lines (101), respectively; a first voltage source (107, 108) that applies a voltage to the infrared detector elements (100) via the plurality of second signal lines (102), respectively; a plurality of output terminals (111) connected to the plurality of first signal lines (101), respectively, the plurality of output terminals (111) being connectable to a signal processing circuit substrate (20) via a plurality of bumps (31), the signal processing circuit substrate (20) including a signal processing circuit (23) that processes output signals of the infrared detector elements (100). The infrared sensor substrate (10) is provide with a monitoring terminal (113) capable of monitoring the voltage applied to the infrared detector elements (100) by the first voltage source (107, 108).

Thus, it is possible to provide an infrared sensor substrate that can be tested independently, before the infrared sensor substrate and the signal processing circuit substrate are assembled into an infrared sensor device. It is possible to use an optimum manufacturing process for each of the infrared sensor substrate and the signal processing circuit substrate. Further, it is possible to test the infrared sensor substrate alone to determine disconnections, short circuits, leakage currents, etc. of the infrared detector element, before the infrared sensor substrate and the signal processing circuit substrate are assembled into an infrared sensor device. Similarly, the signal processing circuit substrate may be tested alone, before the infrared sensor substrate and the signal processing circuit substrate are assembled into an infrared sensor device. Accordingly, it is possible to advantageously reduce the unnecessary steps for assembly and test of the defective chip without actually operating the infrared sensor device, and reduce the cost burden. In addition, it is possible to improve the yield of the final infrared sensor device.

According to the first embodiment, the first voltage source (107, 108) may selectively apply voltage to the infrared detector elements (100) via the plurality of second signal lines (102).

According to the first embodiment, the first current source (105) may be selectively connected to the infrared detector elements (100) via the plurality of first signal lines (101).

Thus, it is possible to specify positions of defective pixels or defective lines.

According to the first embodiment, the first voltage source (107, 108) may include a voltage adjuster circuit that applies a variable voltage to the infrared detector elements (100) via the plurality of second signal lines (102).

Thus, it is possible to accurately detect defective pixels or defective lines.

According to the first embodiment, an infrared sensor device (1) including the infrared sensor substrate (10) and a signal processing circuit substrate (20). The signal processing circuit substrate (20) is formed on a second semiconductor substrate (21), and includes a signal processing circuit (23) that processes output signals of the infrared detector elements (100) of the infrared sensor substrate (10). The infrared sensor substrate (10) has a first surface and a second surface, and the signal processing circuit substrate (20) has a first surface and a second surface. The plurality of output terminals (111) of the infrared sensor substrate (10) are connected to a plurality of input terminals (211) of the signal processing circuit substrate (20) via a plurality of bumps (31). The first surface of the infrared sensor substrate (10) and the first surface of the signal processing circuit substrate (20) are opposed and mechanically coupled to each other at a distance equal to heights of the bumps (31).

According to the first embodiment, the signal processing circuit substrate (20) may further include a second current source (202, 203) connected to the infrared detector elements (100) via the plurality of input terminals (211) of the signal processing circuit substrate (20), the plurality of bumps (31), the plurality of output terminals (111) of the infrared sensor substrate (10), and the plurality of first signal lines (101).

Thus, it is possible to switch between a circuit formed on the first semiconductor substrate 11, and a circuit formed on the second semiconductor substrate 21, for applying a voltage and supplying currents to the pixels 12, in accordance with the application (test or imaging), so as to use one of the two circuits. Therefore, each of the infrared sensor substrate and the signal processing circuit substrate can be tested independently, and when a defect occurs in either circuit, backup operation can be done.

According to the first embodiment, an anti-reflection film for infrared rays may be fainted on the second surface of the signal processing circuit substrate (20).

Thus, it is possible to prevent generation of stray light components due to reflection of infrared rays incident on the signal processing circuit substrate.

According to the first embodiment, a getter thin film (25) that reflects infrared rays may be formed on the second surface of the signal processing circuit substrate (20A).

Thus, it is possible to prevent generation of infrared ray components incident on the signal processing circuit substrate. Since a single thin film serves as both the anti-reflection film and the getter thin film, it is possible to reduce the cost of the infrared sensor device by reducing the number of parts and manufacturing steps.

According to the first embodiment, the getter thin film (25) may be connected to an ground conductor (22) of the signal processing circuit substrate (20A).

Thus, since the getter thin film serves as a shield against noise, it is possible to reduce influence of noise.

According to the first embodiment, the first surface of the infrared sensor substrate (10) and the first surface of the signal processing circuit substrate (20) may be opposed to each other via a plurality of first bumps (31) and a plurality of second bumps (32), and mechanically coupled to each other at a distance equal to heights of the first bumps (31) and the second bumps (32). The plurality of first bumps (31) electrically connect circuits of the infrared sensor substrate (10) and circuits of the signal processing circuit substrate (20). The plurality of second bumps (32) do not electrically connect the circuits of the infrared sensor substrate (10) and the circuits of the signal processing circuit substrate (20).

Thus, the dummy bumps contribute to improvement of mechanical strength between the infrared sensor substrate and the signal processing circuit substrate, and it is possible to improve parallelism (uniformity in interval) of bump connection.

According to the first embodiment, the first bumps (31) and the second bumps (32) may be made of different materials, and the material of the second bumps (32) may have a melting temperature higher than a melting temperature of the material of the first bumps (31).

Thus, the infrared sensor substrate (10) and the signal processing circuit substrate (20) can be coupled to each other with high accuracy.

Second Embodiment

Figure 7:
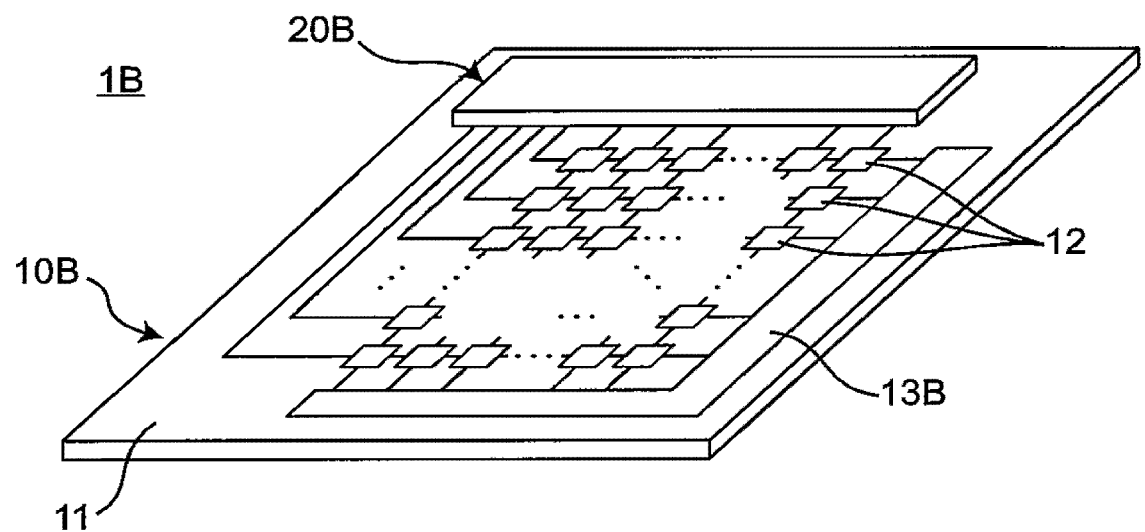
FIG. 7 is a perspective view illustrating a schematic configuration of an infrared sensor device according to a second embodiment of the present invention.

FIG. 7 is a perspective view illustrating a schematic configuration of an infrared sensor device 1B according to a second embodiment of the present invention. The infrared sensor device 1B includes an infrared sensor substrate 10B and a signal processing circuit substrate 20B. The infrared sensor substrate 10B includes a controller circuit 13B, instead of the controller circuit 13 of FIG. 1.

Figure 8:
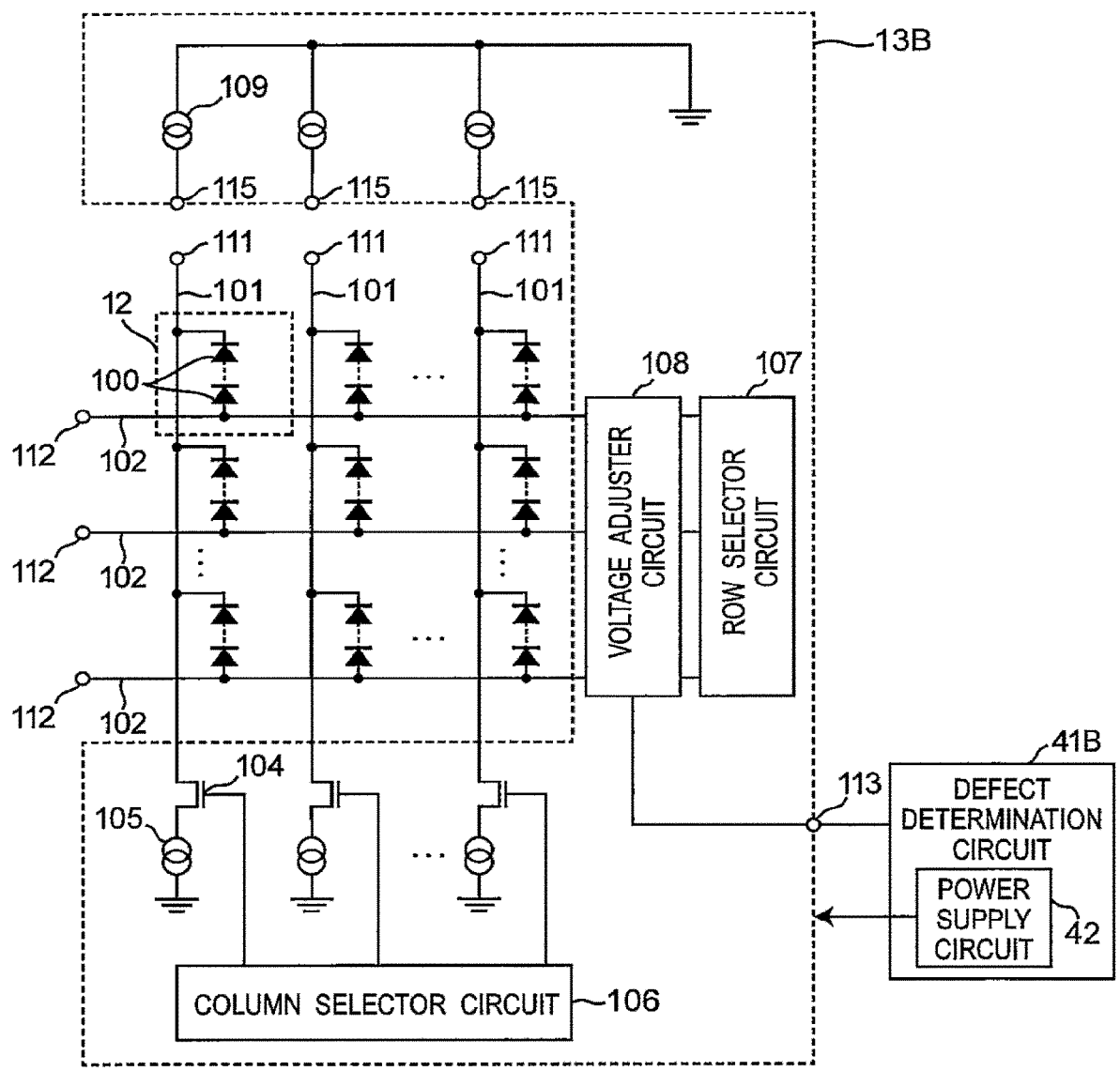
FIG. 8 is a circuit diagram illustrating a pixel array and a controller circuit of an infrared sensor substrate according to the second embodiment of the present invention.

FIG. 8 is a circuit diagram illustrating a pixel array and the controller circuit 13B of the infrared sensor substrate 10B according to the second embodiment of the present invention.

The pixel array of FIG. 8 is configured in a manner similar to that of the pixel array of FIG. 4.

In the controller circuit 13B, the switching elements 103 and the terminals 114 of the controller circuit 13 of FIG. 4 are removed, and the controller circuit 13B further includes additional current sources 109, each of the current sources 109 are provided per one column signal line 101. When circuits of the infrared sensor substrate 10B and circuits of the signal processing circuit substrate 20B are electrically connected to each other via the bumps 31, the current sources 109 are connected to the column signal lines 101 via the bumps 31 and the signal processing circuit substrate 20B.

Figure 9:
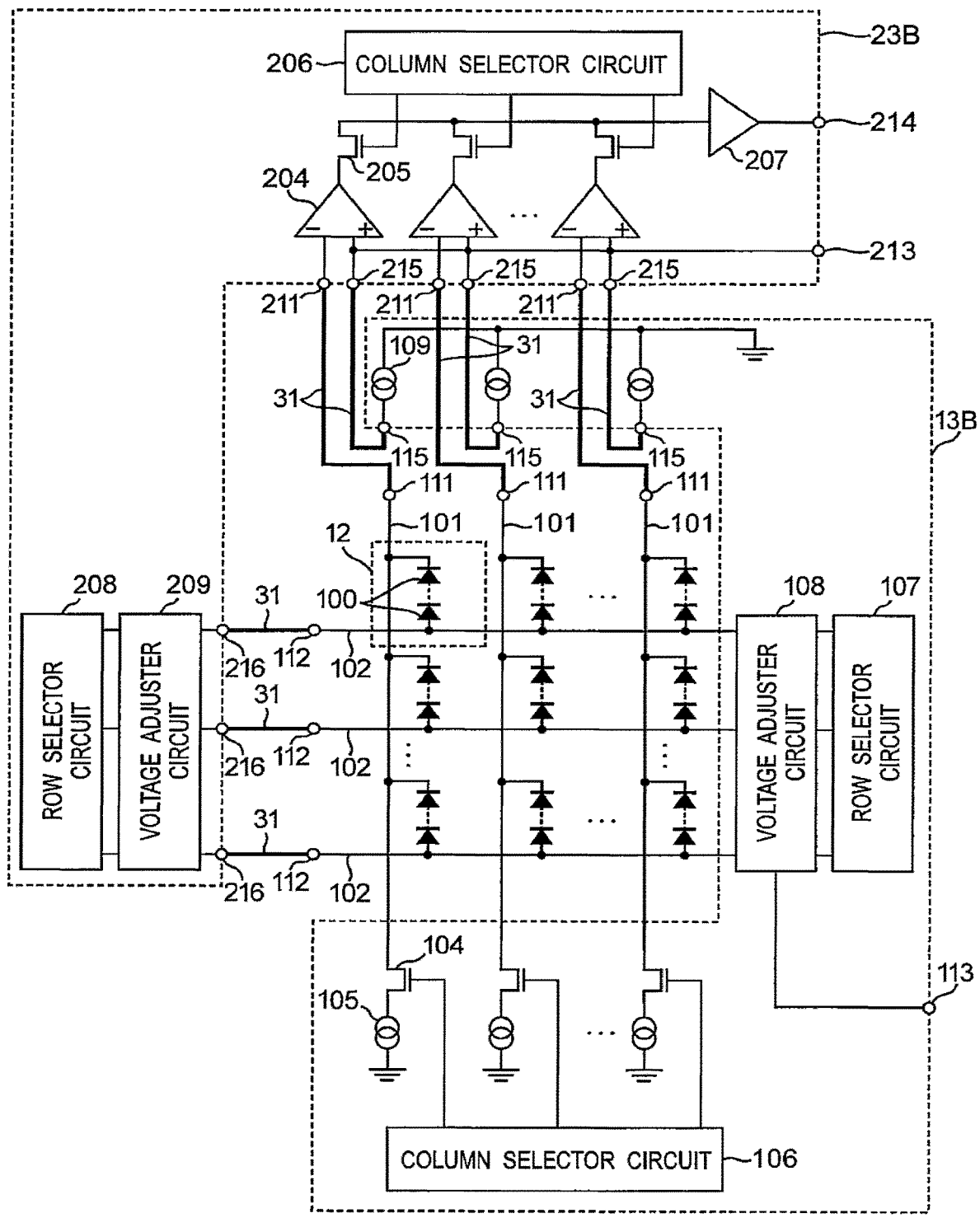
FIG. 9 is a circuit diagram in which the infrared sensor substrate and a signal processing circuit substrate according to the second embodiment of the present invention are assembled into the infrared sensor device.

FIG. 9 is a circuit diagram in which the infrared sensor substrate 10B and the signal processing circuit substrate 20B according to the second embodiment of the present invention are assembled into an infrared sensor device 1B. The terminals 111 of the infrared sensor substrate 10B are connected to the terminals 211 of the signal processing circuit substrate 20B via the bumps 31, respectively. Further, the terminals 112 of the infrared sensor substrate 10B are connected to the terminals 216 of the signal processing circuit substrate 20B via the bumps 31, respectively. In the present specification, the terminals 112 are also referred to as "input terminals" of the infrared sensor substrate 10B, and the terminals 216 are also referred to as "output terminals" of the signal processing circuit substrate 20B.

In a signal processing circuit 23B of the signal processing circuit substrate 20B, the switching elements 201, the current sources 202 and 203, and the terminal 212 of the signal processing circuit 23 of FIG. 6 are removed, and the signal processing circuit 23B further includes a row selector circuit 208 and a voltage adjuster circuit 209. The row selector circuit 208 and the voltage adjuster circuit 209 are configured in a manner similar to those of the row selector circuit 107 and the voltage adjuster circuit 108 of the infrared sensor substrate 10B. Therefore, the row selector circuit 208 and the voltage adjuster circuit 209 apply a voltage to the infrared detector elements 100 via the output terminals 216 of the signal processing circuit substrate 20B, the bumps 31, the input terminals 112 of the infrared sensor substrate 10B, and the row signal lines 102. In the present specification, the row selector circuit 208 and the voltage adjuster circuit 209 are also referred to as a "second voltage source".

The infrared sensor substrate 10B includes at least means for applying a voltage and supplying currents to the pixel array, among the circuits included in the signal processing circuit 23B of the signal processing circuit substrate 20B. The difference from the first embodiment is that the current source 109 to be used when actually operating the infrared sensor device 1 to capture an image is provided not on the signal processing circuit substrate 20B, but on the infrared sensor substrate 10B. Accordingly, by providing the current source 109, including transistors, etc., within the infrared sensor substrate 10B, it is possible to dispose the large current source 109, which contributes to noise reduction of the sensor.

When actually operating the infrared sensor device 1B to capture an image, the column selector circuit 206 and the row selector circuit 208 of the signal processing circuit substrate 20B can select, one by one, the pixels 12 arranged in the two-dimensional array. The row selector circuit 208 and the voltage adjuster circuit 209 apply a variable voltage to the infrared detector elements 100 of pixels 12.

According to the second embodiment, since the signal processing circuit substrate 20B also includes the row selector circuit 208 and the voltage adjuster circuit 209, it is possible to apply a voltage to the infrared detector elements 100 of the pixels 12 from both ends of the pixel array, and thus, further reduce voltage drop distribution due to horizontal wiring resistance.

The infrared sensor device according to the second embodiment has the following configurations and advantageous effects.

According to the second embodiment, the infrared sensor substrate (10B) further includes a plurality of input terminals (112) connected to the plurality of second signal lines (102), respectively. The plurality of input terminals (112) of the infrared sensor substrate (10B) are connected to the plurality of output terminals (111) of the signal processing circuit substrate (20B) via the plurality of bumps (31).

According to the second embodiment, the signal processing circuit substrate (20B) may further include a second voltage source (208, 209) that applies a voltage to the infrared detector elements (100) via the plurality of output terminals (216) of the signal processing circuit substrate (20B), the plurality of bumps (31), the plurality of input terminals (112) of the infrared sensor substrate (10B), and the plurality of second signal lines (102).

Thus, it is possible to apply a voltage to the pixels from both ends of the pixel array, and thus, reduce the voltage drop distribution due to the horizontal wiring resistance. Further, by forming the row selector circuit and the voltage adjuster circuit in each of the infrared sensor substrate and the signal processing circuit substrate, it is possible to disperse the circuit area, and prevent an increase in the chip size due to the addition of the circuit.

Third Embodiment

Figure 10:
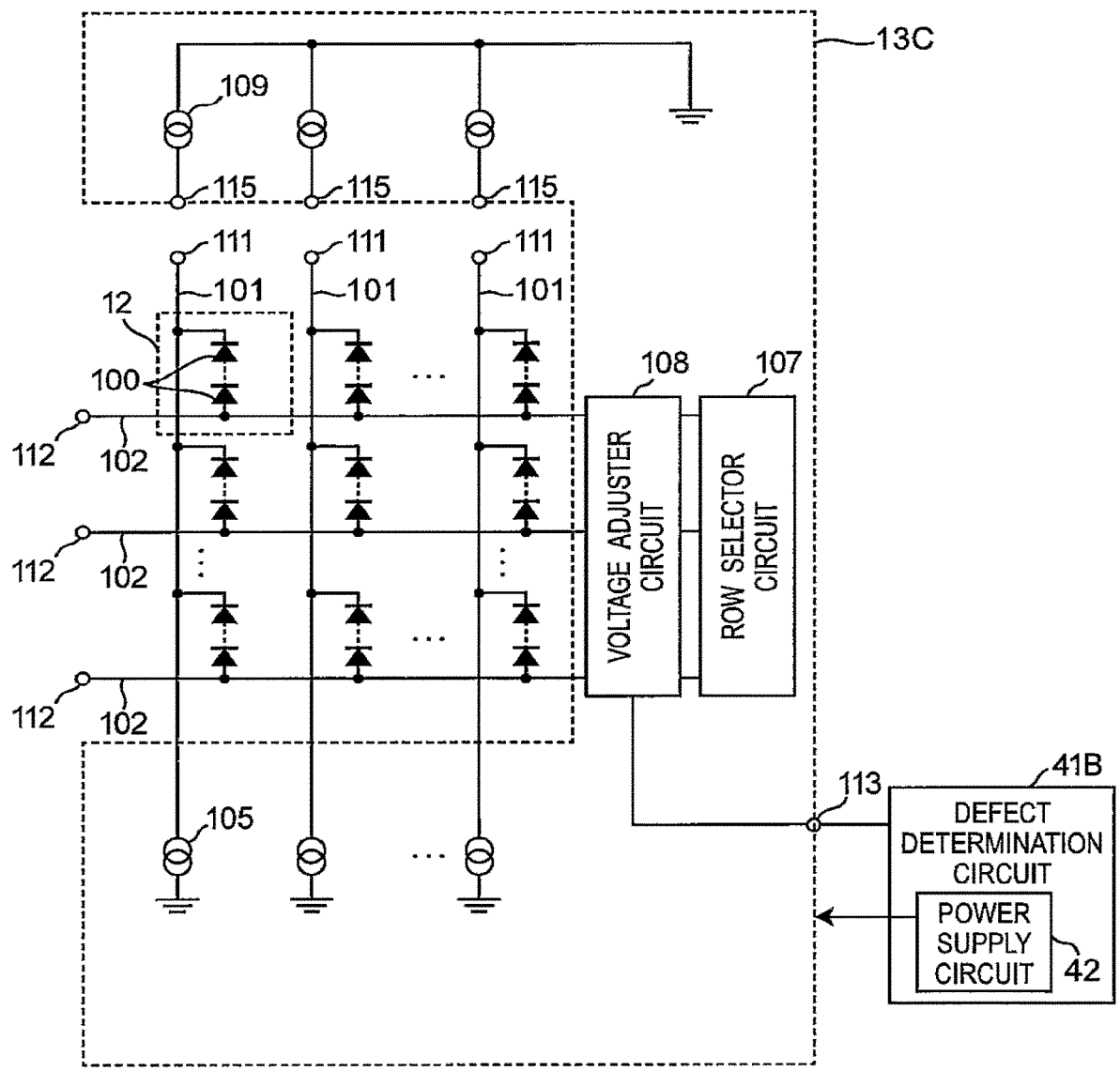
FIG. 10 is a circuit diagram illustrating a pixel array and a controller circuit of an infrared sensor substrate according to a third embodiment of the present invention.

FIG. 10 is a circuit diagram illustrating a pixel array and controller circuit 13C of an infrared sensor substrate according to a third embodiment of the present invention. The controller circuit 13C has a configuration in which the plurality of switching elements 104 and the column selector circuit 106 of the controller circuit 13B of FIG. 8 are removed.

Figure 11:
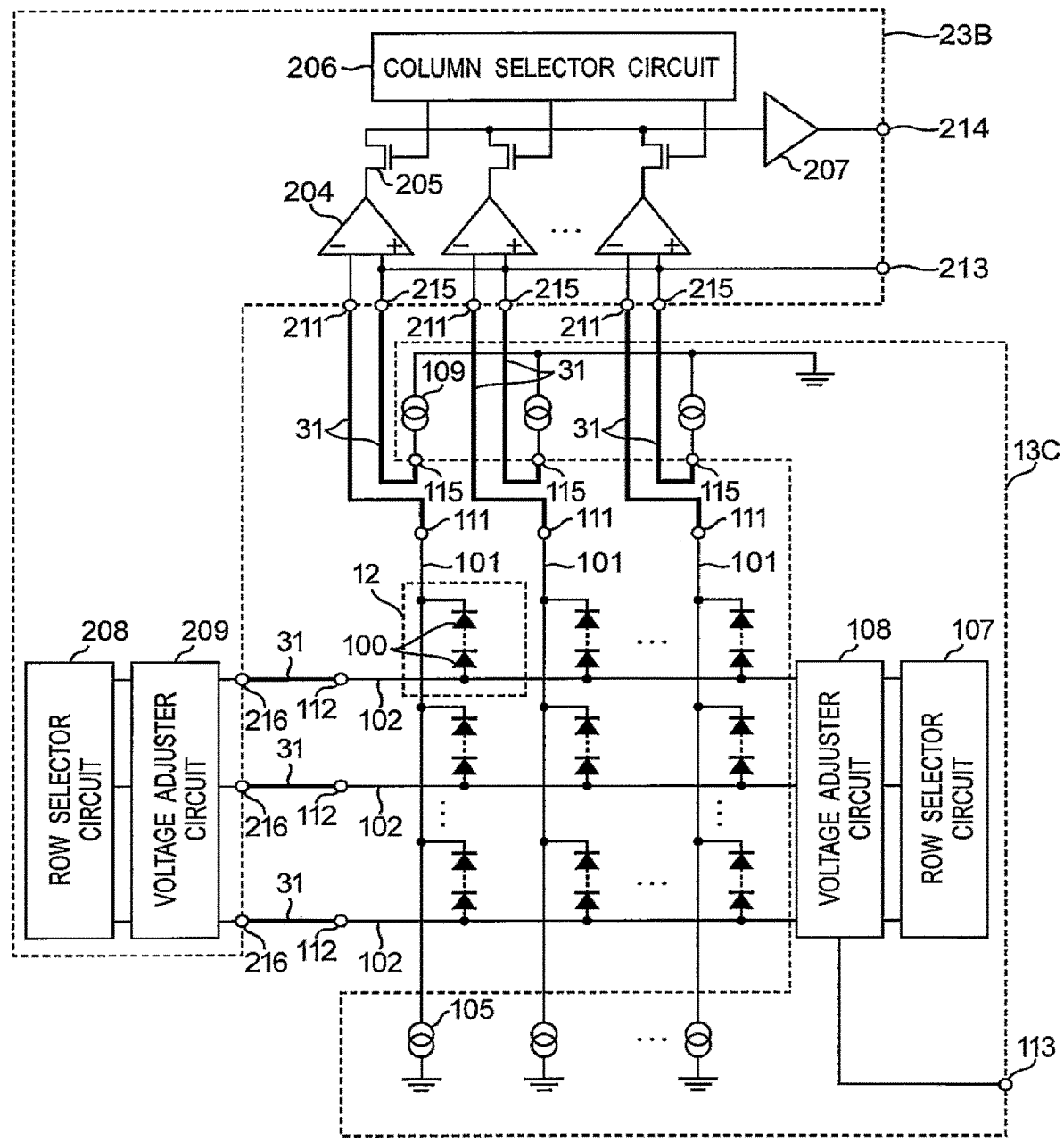
FIG. 11 is a circuit diagram in which the infrared sensor substrate and a signal processing circuit substrate according to the third embodiment of the present invention are assembled into an infrared sensor device.

FIG. 11 is a circuit diagram in which the infrared sensor substrate and a signal processing circuit substrate according to the third embodiment of the present invention are assembled into an infrared sensor device. The infrared sensor device of FIG. 11 is configured in a manner similar to that of the infrared sensor device of FIG. 9, except that the plurality of switching elements 104 and the column selector circuit 106 of the controller circuit 13B of FIG. 9 are removed.

In the third embodiment, the infrared sensor substrate includes at least means for applying a voltage and supplying currents to the pixel array, among those of the signal processing circuit of the signal processing circuit substrate. The difference from the second embodiment is that the infrared detector elements 100 of the pixels 12 are directly connected to the current sources 105 per one column, and when testing the infrared sensor substrate, voltages are simultaneously applied to the infrared detector elements 100 of the pixels 12 on the respective rows. The row selector circuit 107 and the voltage adjuster circuit 108 apply a variable voltage to the infrared detector elements 100 of the pixels 12, and by monitoring the voltage, the defect determination circuit 41 can determine defective pixels or defective lines. Thus, even when the signal processing circuit substrate is not connected to the infrared sensor substrate, it is possible to test the infrared sensor substrate alone for to determine disconnections, short circuits, or leakage currents of the pixel 12s. Hence, it is possible to screen defective chips without actually operating the entire infrared sensor device.

According to the third embodiment, it is advantageously possible to apply a voltage to the pixels from both ends of the pixel array in a manner similar to that of the second embodiment, and thus, further reduce the voltage drop distribution due to the horizontal wiring resistance. Further, by forming the row selector circuit and the voltage adjuster circuit in each of the infrared sensor substrate and the signal processing circuit substrate, it is possible to disperse the circuit area, and prevent an increase in the chip size due to the addition of the circuit.

Fourth Embodiment

Figure 12:
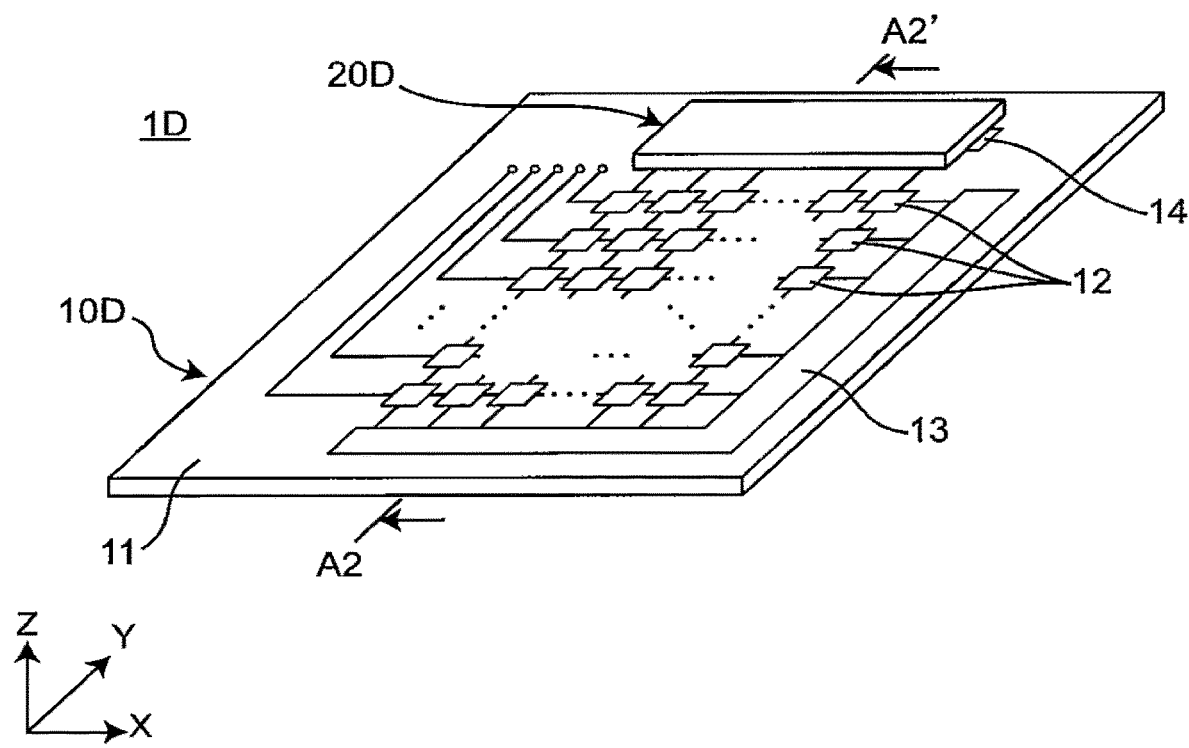
FIG. 12 is a perspective view illustrating a schematic configuration of an infrared sensor device according to a fourth embodiment of the present invention.
Figure 13:
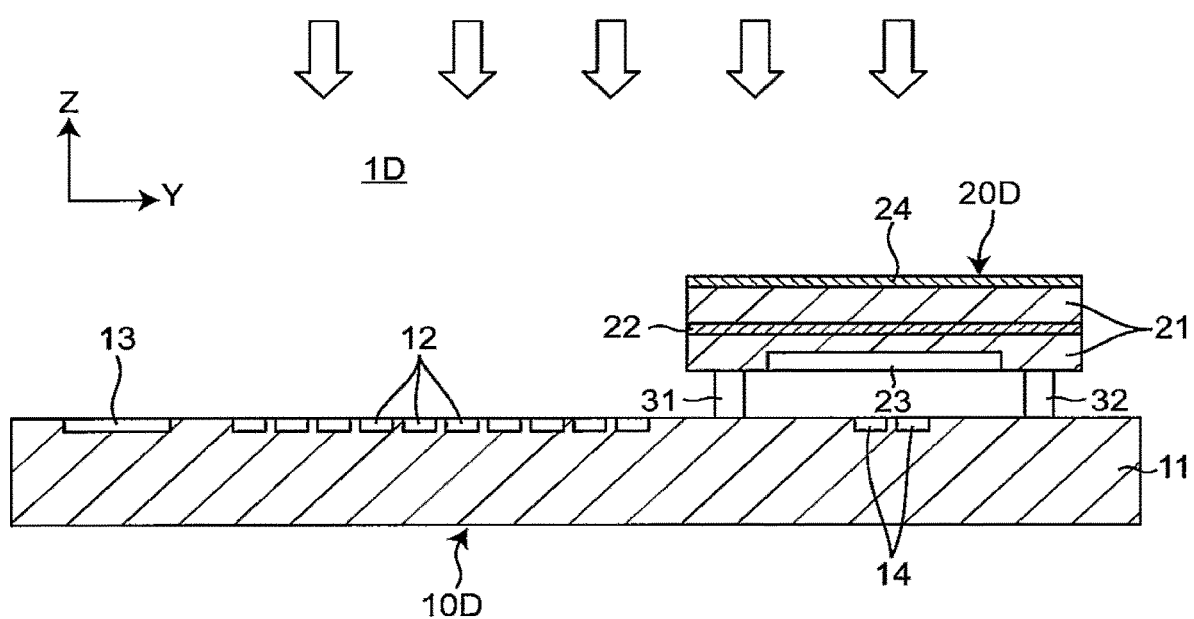
FIG. 13 is a cross sectional view illustrating a schematic configuration of the infrared sensor device according to the fourth embodiment of the present invention.

FIG. 12 is a perspective view illustrating a schematic configuration of an infrared sensor device according to a fourth embodiment of the present invention. FIG. 13 is a cross sectional view illustrating a schematic configuration of the infrared sensor device according to the fourth embodiment of the present invention. FIG. 13 is a cross sectional view along a line A2-A2' in FIG. 12.

The infrared sensor device 1D includes an infrared sensor substrate 10D and a signal processing circuit substrate 20D.

The infrared sensor substrate 10D further includes at least one reference pixel 14 including an infrared detector element 100, in a region in which the +Z side surface of the infrared sensor substrate 10D and the −Z side surface of the signal processing circuit substrate 20D are opposed to each other (i.e., a region which is on the infrared sensor substrate 10D and in which incident infrared rays are blocked by the signal processing circuit substrate 20D). The reference pixel 14 outputs a signal that varies in accordance with the temperature of the infrared detector element 100.

Based on the output signal of the reference pixel 14, the signal processing circuit substrate 20D removes components derived from the temperature of the infrared detector element 100 from the output signals of the infrared detector elements 100 of the pixels 12.

An anti-reflection film 24 for infrared rays may be formed in a region other than electrodes on the surface of the signal processing circuit substrate 20D.

According to the fourth embodiment, the infrared sensor device 1D can remove the components derived from the temperature of the infrared detector element 100, from the output signals of the infrared detector elements 100 of the pixels 12, and capture an image with higher accuracy.

The infrared sensor device 1D according to the fourth embodiment has the following configurations and advantageous effects.

According to the four embodiment, the infrared sensor substrate (10D) further includes at least one reference pixel (14) including an infrared detector element (100) in a region where the first surface of the infrared sensor substrate (10D) and the first surface of the signal processing circuit substrate (20D) are opposed to each other. The reference pixel (14) outputs a signal that varies in accordance with a temperature of the infrared detector element (100).

Thus, it is possible to eliminate components derived from the temperature of the sensor, from the signals of the infrared detection pixels, using the reference pixel which is substantially irresponsive to the incident infrared rays and outputs a signal corresponding to the sensor temperature.

According to the four embodiment, an anti-reflection film (24) for infrared rays is formed in a region other than electrodes on a surface of the signal processing circuit substrate (20D).

Thus, it is possible to prevent generation of stray light components due to reflection of infrared rays incident on the signal processing circuit substrate.

FIFTH EMBODIMENT

Figure 14:
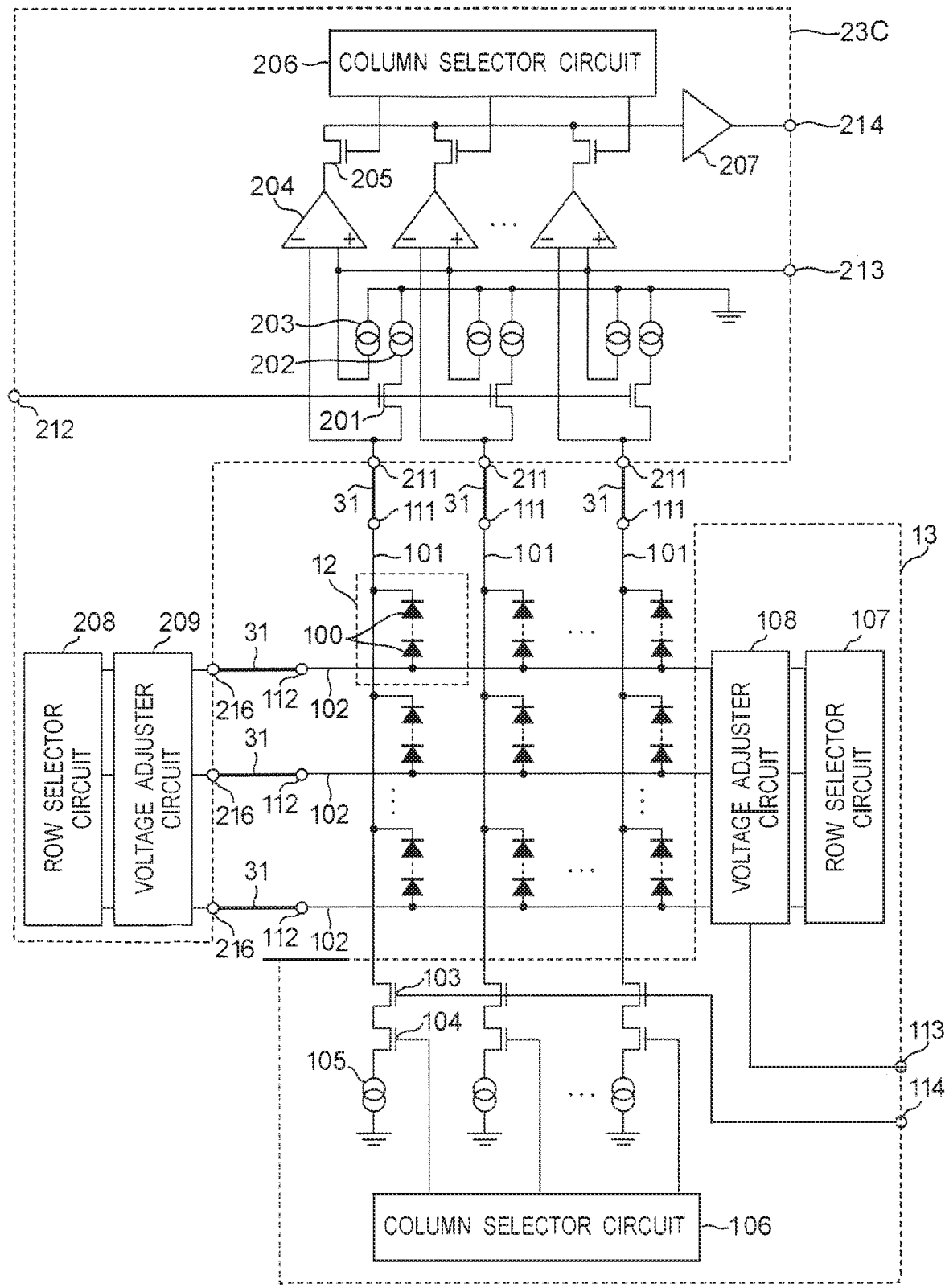
FIG. 14 is a circuit diagram in which the infrared sensor substrate and a signal processing circuit substrate according to the fifth embodiment of the present invention are assembled into an infrared sensor device.

FIG. 14 is a circuit diagram in which the infrared sensor substrate and a signal processing circuit substrate according to the fifth embodiment of the present invention are assembled into an infrared sensor device.

Referring to FIG. 14, an infrared sensor device includes: an infrared sensor substrate formed on a first semiconductor substrate; and a signal processing circuit substrate formed on a second semiconductor substrate.

The infrared sensor substrate includes: a plurality of first signal lines 101 extending along a first direction on the first semiconductor substrate; a plurality of second signal lines 102 extending along a second direction on the first semiconductor substrate; a pixel array including a plurality of pixels 12 arranged in a two-dimensional array along the first direction and the second direction, the plurality of pixels 12 including infrared detector elements 100, respectively, each of the infrared detector elements 100 connected to one of the plurality of first signal lines 101 and connected to one of the plurality of second signal lines 102; a first current source 105 connected to the infrared detector elements 100 via the plurality of first signal lines 101, respectively; a first voltage source 107, 108 that applies a voltage to the infrared detector elements 100 via the plurality of second signal lines 102, respectively; a plurality of output terminals 111 corresponding to the plurality of first signal lines 101 one-by-one basis, and connected to the plurality of first signal lines 101, respectively; a plurality of input terminals 102 corresponding to the plurality of second signal lines 102 one-by-one basis, and connected to the plurality of second signal lines 102, respectively, and a monitoring terminal 113 capable of monitoring the voltage applied to the infrared detector elements 100 by the first voltage source 107, 108.

The signal processing circuit substrate includes: a plurality of input terminals 211 electrically connected to the plurality of output terminals 111 of the infrared sensor substrate, respectively; a signal processing circuit 23C that receives and processes output signals of the infrared detector elements 100 of the infrared sensor substrate via the plurality of input terminals 211 of the signal processing circuit substrate, the plurality of output terminals 111 of the infrared sensor substrate, and the plurality of first signal lines 101 plurality of output terminals 216 electrically connected to the plurality of input terminals 102 of the infrared sensor substrate, respectively; and a second voltage source 208, 209 that applies a voltage to the infrared detector elements 100 via the plurality of output terminals 216 of the signal processing circuit substrate, the plurality of input terminals 102 of the infrared sensor substrate, and the plurality of second signal lines 102. The first voltage source 107, 108 applies the voltage to the infrared detector elements 100, at the same time as the second voltage source 208, 209 applies the voltage to the infrared detector elements 100.

The signal processing circuit substrate further includes a second current source 202, 203 connected to the infrared detector elements 100 via the plurality of input terminals 211 of the signal processing circuit substrate, the plurality of output terminals 111 of the infrared sensor substrate, and the plurality of first signal lines 101.

REFERENCE SIGNS LIST 1, 1A, 113, 1D: INFRARED SENSOR DEVICE,
10, 10B, 10D: INFRARED SENSOR SUBSTRATE,
11: FIRST SEMICONDUCTOR SUBSTRATE,
12: PIXEL,
13, 13B, 13C: CONTROLLER CIRCUIT,
14: REFERENCE PIXEL,
20, 20A, 20B, 20D: SIGNAL PROCESSING CIRCUIT SUBSTRATE,
21: SECOND SEMICONDUCTOR SUBSTRATE,
22: GROUND CONDUCTOR,
23, 23B: SIGNAL PROCESSING CIRCUIT,
24: ANTI-REFLECTION FILM,
25: GETTER THIN FILM,
31: BUMP,
32: DUMMY BUMP,
41, 41B: DEFECT DETERMINATION CIRCUIT,
42: POWER SUPPLY CIRCUIT,
100: INFRARED DETECTOR ELEMENT,
101: COLUMN SIGNAL LINE,
102: ROW SIGNAL LINE,
103, 104: SWITCHING ELEMENT,
105: CURRENT SOURCE,
106: COLUMN SELECTOR CIRCUIT,
107: ROW SELECTOR CIRCUIT,
108: VOLTAGE ADJUSTER CIRCUIT,
109: CURRENT SOURCE,
111 to 114: TERMINAL,
121: SWITCHING ELEMENT,
122, 123: AMPLIFIER,
201: SWITCHING ELEMENT,
202, 203: CURRENT SOURCE,
204: OPERATIONAL AMPLIFIER,
205: SWITCHING ELEMENT,
206: COLUMN SELECTOR CIRCUIT,
207: AMPLIFIER,
208: ROW SELECTOR CIRCUIT,
209: VOLTAGE ADJUSTER CIRCUIT, and
211 to 215: TERMINAL.

The invention claimed is:
1. An infrared sensor device comprising:
an infrared sensor substrate formed on a first semiconductor substrate; and
a signal processing circuit substrate formed on a second semiconductor substrate, wherein the infrared sensor substrate comprises:
a plurality of first signal lines extending along a first direction on the first semiconductor substrate;
a plurality of second signal lines extending along a second direction on the first semiconductor substrate;
a pixel array including a plurality of pixels arranged in a two-dimensional array along the first direction and the second direction, the plurality of pixels including infrared detector elements, respectively, each of the infrared detector elements connected to one of the plurality of first signal lines and connected to one of the plurality of second signal lines;

a first current source connected to the infrared detector elements via the plurality of first signal lines, respectively;

a first voltage source that applies a voltage to the infrared detector elements via the plurality of second signal lines, respectively;

a plurality of output terminals corresponding to the plurality of first signal one-by-one basis, and connected to the plurality of first signal lines, respectively;

a plurality of input terminals corresponding to the plurality of second signal lines one-by-one basis, and connected to the plurality of second signal lines, respectively, and a monitoring terminal capable of monitoring the voltage applied to the infrared detector elements by the first voltage source, wherein the signal processing circuit substrate comprises:

a plurality of input terminals electrically connected to the plurality of output terminals of the infrared sensor substrate, respectively;

a signal processing circuit that receives and processes output signals of the infrared detector elements of the infrared sensor substrate via the plurality of input terminals of the signal processing circuit substrate, the plurality of output terminals of the infrared sensor substrate, and the plurality of first signal lines;

a plurality of output terminals electrically connected to the plurality of input terminals of the infrared sensor substrate, respectively; and a second voltage source that applies a voltage to the infrared detector elements via the plurality of output terminals of the signal processing circuit substrate, the plurality of input terminals of the infrared sensor substrate, and the plurality of second signal lines; and wherein the first voltage source applies the voltage to the infrared detector elements, at the same time as the second voltage sources applies the voltage to the infrared detector elements.

2. The infrared sensor device according to claim 1, wherein
the first voltage source selectively applies the voltage to he infrared detector elements via the plurality of second signal lines.

3. The infrared sensor device according to claim 1, wherein
the first current source is selectively connected to the infrared detector elements via the plurality of first signal lines.

4. The infrared sensor device according to claim 1, wherein
the first voltage source includes a voltage adjuster circuit that applies a variable voltage to the infrared detector elements via the plurality of second signal lines.

5. The infrared sensor device according to claims 1, wherein
the signal processing circuit substrate further includes a second current source connected to the infrared detector elements via the plurality of input terminals of the signal processing circuit substrate, the plurality of output terminals of the infrared sensor substrate, and the plurality of first signal lines.

6. The infrared sensor device according to claim 1, wherein
the infrared sensor substrate has a first surface and a second surface, wherein
the signal processing circuit substrate has a first surface and a second surface, wherein
the plurality of output terminals and the plurality of input terminals of the infrared sensor substrate are electrically connected to the plurality of input terminals and the plurality of output terminals of the signal processing circuit substrate via a plurality of first bumps, and wherein
the first surface of the infrared sensor substrate and the first surface of the signal processing circuit substrate are opposed and mechanically coupled to each other at a distance equal to heights of the first bumps.

7. The infrared sensor device according to claim 6, wherein
an anti-reflection film for infrared rays is formed on the second surface of the signal processing circuit substrate.

8. The infrared sensor device according to claim 6, wherein
a getter thin film that reflects infrared rays is formed on an uppermost surface of the second surface of the signal processing circuit substrate.

9. The infrared sensor device according to claim 8, wherein
the getter thin film is connected to an ground conductor of the signal processing circuit substrate.

10. The infrared sensor device according to claim 6, wherein
the infrared sensor substrate further includes at least one reference pixel including a second infrared detector element in a region where the first surface of the infrared sensor substrate and the first surface of the signal processing circuit substrate are opposed to each other, and wherein
the at least one reference pixel outputs a signal that varies in accordance with a temperature of the second infrared detector element.

11. The infrared sensor device according to claim 6, wherein
the first surface of the infrared sensor substrate and the first surface of the signal processing circuit substrate are opposed to each other via the plurality of first bumps and a plurality of second bumps, and mechanically coupled to each other at a distance equal to heights of the first bumps and the second bumps, wherein
the plurality of first bumps electrically connect the infrared sensor substrate and the signal processing circuit substrate, and wherein
the plurality of second bumps do not electrically connect the infrared sensor substrate and the signal processing circuit substrate.

12. The infrared sensor device according to claim 11, wherein
the first and second humps are made of different materials, and the material of the second bumps has a melting temperature higher than a melting temperature of the material of the first bumps.

\* \* \* \* \*